United States Patent
Lin

(10) Patent No.: US 10,591,538 B2
(45) Date of Patent: Mar. 17, 2020

(54) DATA READING DEVICE AND DATA READING METHOD FOR DESIGN-FOR-TESTING

(71) Applicant: Winbond Electronics Corp., Taichung (TW)

(72) Inventor: Che-Min Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 7 days.

(21) Appl. No.: 16/046,942

(22) Filed: Jul. 26, 2018

(65) Prior Publication Data

US 2020/0033407 A1   Jan. 30, 2020

(51) Int. Cl.
*G01R 31/317* (2006.01)

(52) U.S. Cl.
CPC . *G01R 31/31725* (2013.01); *G01R 31/31727* (2013.01)

(58) Field of Classification Search
CPC .................................................. H04L 1/0009
USPC ........................................ 714/774, 776, 757
See application file for complete search history.

(56) References Cited

U.S. PATENT DOCUMENTS

| | | | | |
|---|---|---|---|---|
| 5,530,706 A | * | 6/1996 | Josephson | G01R 31/318541 307/407 |
| 5,684,997 A | * | 11/1997 | Kau | G06F 13/24 710/260 |
| 5,721,933 A | * | 2/1998 | Walsh | G06F 1/1632 307/31 |
| 6,380,780 B1 | * | 4/2002 | Aitken | G01R 31/318541 327/202 |
| 6,715,096 B2 | | 3/2004 | Kuge | |
| 9,666,302 B1 | * | 5/2017 | Chang | G11C 7/10 |
| 2004/0246801 A1 | | 12/2004 | Lee et al. | |
| 2012/0299606 A1 | | 11/2012 | Oshima | |
| 2016/0233134 A1 | * | 8/2016 | Lim | H01L 22/20 |

OTHER PUBLICATIONS

"Office Action of Taiwan Counterpart Application," dated Dec. 27, 2018, p. 1-p. 7.

* cited by examiner

*Primary Examiner* — Fritz Alphonse
(74) *Attorney, Agent, or Firm* — JCIPRNET

(57) ABSTRACT

A data reading device and a data reading method for design-for-testing are provided. The data reading device includes a buffer and a data serialization circuit. The data serialization circuit receives a clock positive edge-triggered signal, a clock negative edge-triggered signal, a trigger mask signal, and test data. The data serialization circuit masks one of the clock positive edge-triggered signal and the clock negative edge-triggered signal according to the trigger mask signal, and provides a part of the test data to an output terminal of the data serialization circuit as an output signal of the data reading device according to the unmasked one of the clock positive edge-triggered signal and the clock negative edge-triggered signal. Thus, a data valid window of the test data can be increased.

9 Claims, 5 Drawing Sheets

DATA READING DEVICE AND DATA READING METHOD FOR DESIGN-FOR-TESTING

BACKGROUND OF THE INVENTION

Field of the Invention

The disclosure relates to a design-for-testing (DFT) technique, and in particular, to a data reading device and a data reading method for design-for-testing.

Description of Related Art

In the design-for-testing technique, to facilitate testing or validation on the function of a chip or circuit, a relevant testing circuit is generally implanted in the design phase of the circuit to perform testing after the circuit design is completed.

When a test machine measures signals of the chip or circuit, delayed enablement/disablement of signals occurs in the transmission process because signal transmission speeds of pins in the testing circuit differ due to the differences in the pin resistance, the wiring length, and the logic gate response time. This phenomenon may be referred to as data skew. As techniques of semiconductor manufacturing processes improve and transmission capacities of communication specifications gradually increase, it is expected that the signal transmission speed of circuits will increase, but the available data valid window will also decrease. Moreover, when the pin is adjacent to a power line, data skew of signals in the pin may also occur due to power transmission of the power line.

As a result, it becomes more and more difficult to accurately obtain test signals from the data valid window at a high speed. Therefore, how to more easily obtain and test the test signals is one of the issues that have long existed in the field of signal testing.

SUMMARY OF THE INVENTION

The invention provides a data reading device and a data reading method for design-for-testing to increase the available data valid window in test signals.

The data reading device for design-for-testing according to an embodiment of the invention includes a buffer and a data serialization circuit. The buffer is configured to temporarily store test data. The data serialization circuit is coupled to the buffer. The data serialization circuit receives a clock positive edge-triggered signal, a clock negative edge-triggered signal, a trigger mask signal, and the test data. The data serialization circuit masks one of the clock positive edge-triggered signal and the clock negative edge-triggered signal according to the trigger mask signal, and provides a part of the test data to an output terminal of the data serialization circuit as an output signal of the data reading device according to the unmasked one of the clock positive edge-triggered signal and the clock negative edge-triggered signal.

The data reading method for design-for-testing according to an embodiment of the invention is applicable to a data reading device including a data serialization circuit. The data reading method includes the following steps. A clock positive edge-triggered signal, a clock negative edge-triggered signal, a trigger mask signal, and test data are obtained. One of the clock positive edge-triggered signal and the clock negative edge-triggered signal is masked according to the trigger mask signal, and a part of the test data is provided to an output terminal of the data serialization circuit as an output signal of the data reading device according to the unmasked one of the clock positive edge-triggered signal and the clock negative edge-triggered signal.

In light of the above, when reading the test signals, the data reading device and the data reading method according to the embodiments of the invention can use the additionally disposed trigger mask signal to block or mask one of the clock positive edge-triggered signal and the clock negative edge-triggered signal, and can use the other unmasked one of the triggered signals to obtain the corresponding part of the test data. Accordingly, the output time of the test data is increased from half of one clock cycle of the original clock to one clock cycle. Thereby, without adjusting the internal data type inside the chip using the data reading device or changing the clock or other relevant configurations, the available data valid window can be increased, and the external test machine can more easily determine accuracy of the test data obtained by the data reading device.

To provide a further understanding of the aforementioned and other features and advantages of the disclosure, exemplary embodiments, together with the reference drawings, are described in detail below.

DESCRIPTION OF THE EMBODIMENTS

Figure 1:
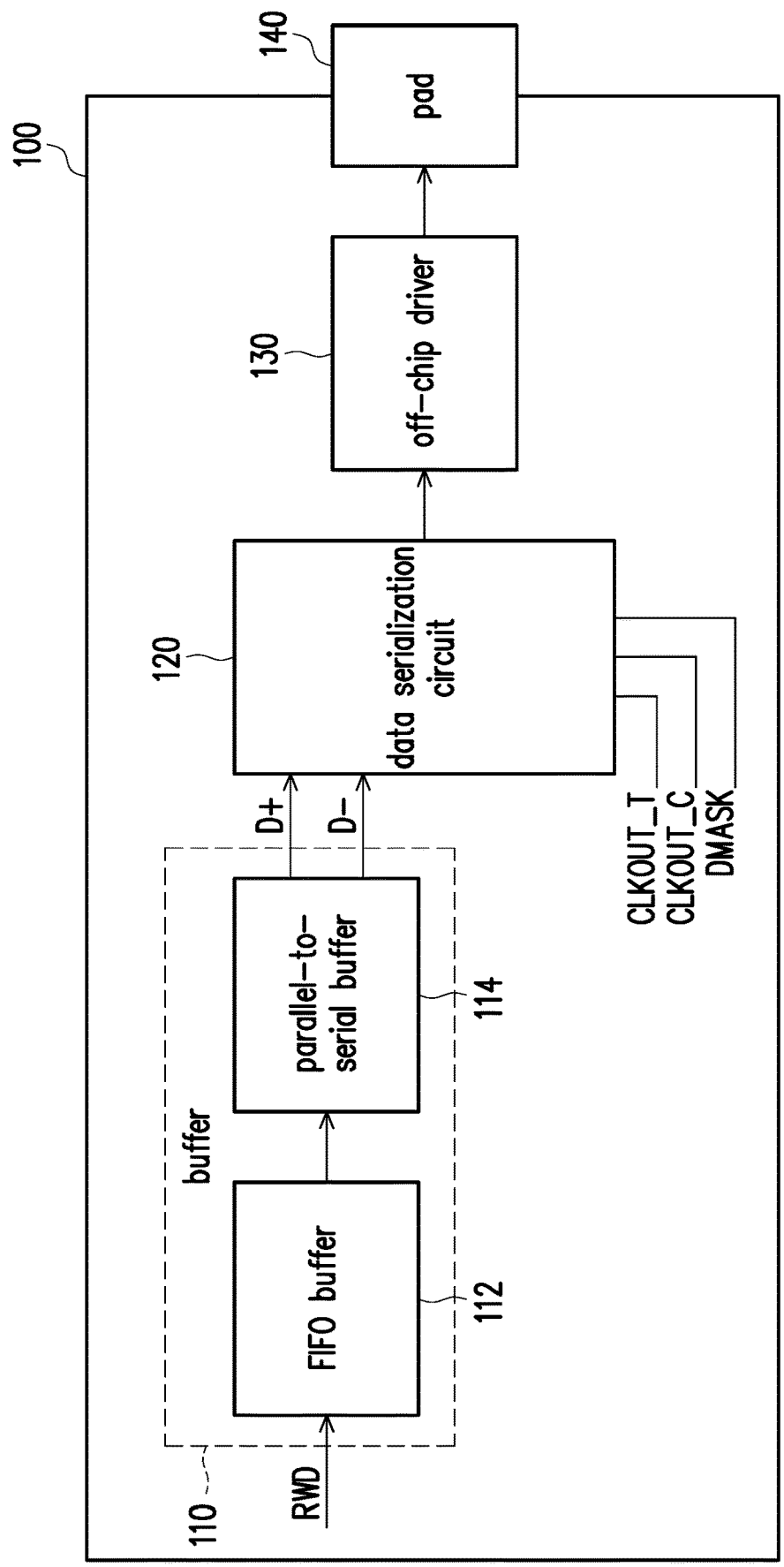
FIG. 1 is a block diagram illustrating a data reading device according to an embodiment of the invention.

As shown in FIG. 1, a data reading device 100 is applicable to a dynamic random-access memory (DRAM) device, and in particular, to a low-power DRAM device. To reduce power consumption, the low-power DRAM device removes a delay lock loop (DLL) from the original DRAM framework, which reduces transmission stability of data in the DRAM device. The data reading device 100 of the present embodiment may be disposed in a chip, and an external test machine located outside the chip may use the data reading device 100 to read relevant signals or data to be measured.

The data reading device 100 in FIG. 1 mainly includes a buffer 110 and a data serialization circuit 120. The buffer 110 is configured to temporarily store test data RWD obtained from a memory array. Specifically, the memory array may be positioned according to a memory address. Data corresponding to the memory address and located in the memory array is read via a read/write data line to form the test data RWD, and the test data RWD is temporarily stored to the buffer 110.

The buffer 110 of the present embodiment includes a FIFO (first in, first out) buffer 112 and a parallel-to-serial buffer 114. The FIFO buffer 112 provides earlier-obtained data to its output terminal first, and after the earlier data are all output, later-obtained data is then output for subsequent components to use. The parallel-to-serial buffer 114 is coupled to the FIFO buffer 112 and converts test data transmitted in a parallel form into test data transmitted in a serial form. A person implementing the present embodiment may adjust the structure of the buffer 110 according to the internal data form of the DRAM device and the external output data form of the DRAM device.

The data serialization circuit 120 receives a clock positive edge-triggered signal CLKOUT_T, a clock negative edge-triggered signal CLKOUT_C, a trigger mask signal DMASK, and the test data obtained from the buffer 110. In the present embodiment, the test data includes positive edge test data D+ corresponding to the clock positive edge-triggered signal CLKOUT_T and negative edge test data D− corresponding to the clock negative edge-triggered signal CLKOUT_C. The positive edge test data D+ and the negative edge test data D− are both a part of the test data. In other words, the data serialization circuit 120 uses the enabled clock positive edge-triggered signal CLKOUT_C to output the positive edge test data D+ to a pad 140, and the data serialization circuit 120 also uses the enabled clock negative edge-triggered signal CLKOUT_C to output the negative edge test data D− to the pad 140.

The data serialization circuit 120 masks one of the clock positive edge-triggered signal CLKOUT_T and the clock negative edge-triggered signal CLKOUT_C according to the trigger mask signal DMASK, and provides a part of the test data to an output terminal of the data serialization circuit 120 as an output signal of the data reading device 100 according to the unmasked one of the clock positive edge-triggered signal CLKOUT_T and the clock negative edge-triggered signal CLKOUT_C. In the embodiment below, a detailed actuation method of the data serialization circuit 120 will be described.

The data reading device 100 in FIG. 1 further includes an off-chip driver (OCD) 130 and the pad 140. The data reading device 100 uses the off-chip driver 130 and the pad 140 to output the output signal of the data reading device 100 via the pad 140 to a device (e.g., a test machine) electrically coupled to the pad 140. The off-chip driver 130 is coupled to the data serialization circuit 120 to receive the output signal of the data reading device 100. The pad 140 is electrically connected to the off-chip driver 130. The off-chip driver 130 provides a part of the test data to the pad 140 according to the output signal provided by the output terminal of the data serialization circuit 120.

Figure 2:
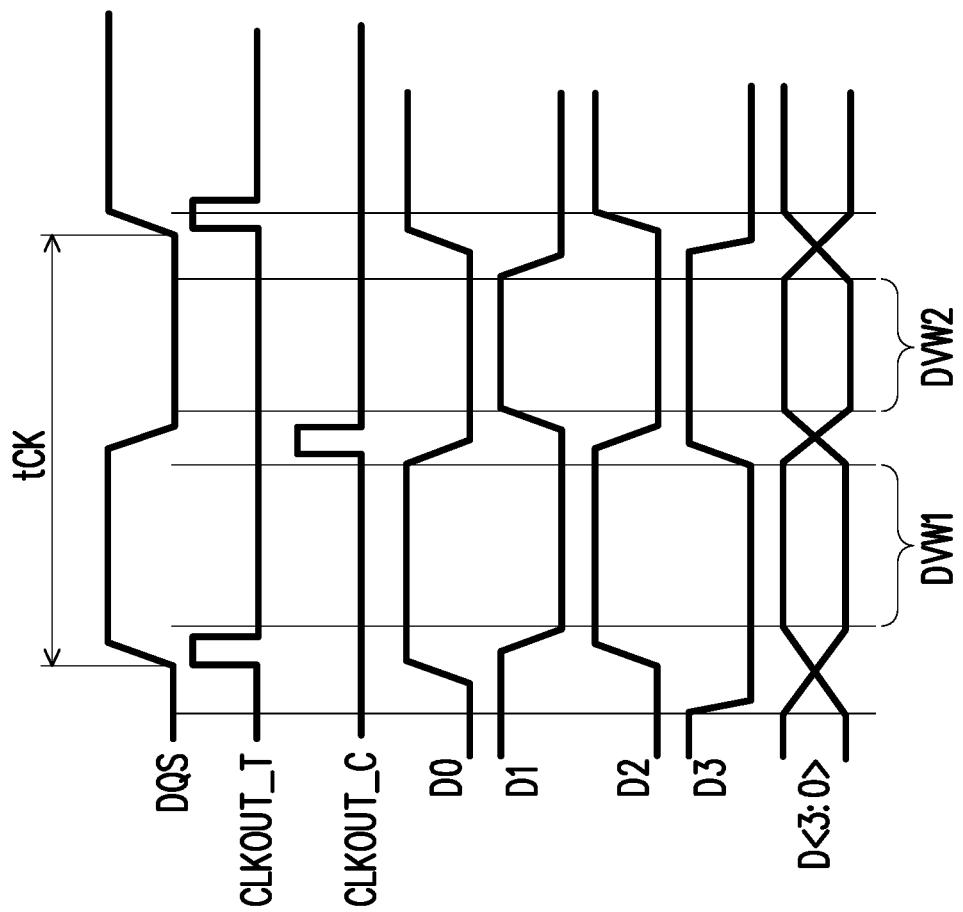
FIG. 2 is a waveform diagram illustrating a clock signal DQS, a clock positive edge-triggered signal CLKOUT_T, a clock negative edge-triggered signal CLKOUT_C, and test data D0 to D3 and D<3:0>.

Referring to FIG. 2, when a clock signal DQS undergoes a transition from the negative edge to the positive edge, the clock positive edge-triggered signal CLKOUT_T is enabled. When the clock signal DQS undergoes a transition from the positive edge to the negative edge, the clock negative edge-triggered signal CLKOUT_C is enabled. It is assumed here that the data serialization circuit 120 of FIG. 1 does not use the trigger mask signal to implement the present embodiment. To output the test data as soon as possible, the data serialization circuit 120 generally transmits a data when the clock positive edge-triggered signal CLKOUT_T is enabled and transmits another data when the clock negative edge-triggered signal CLKOUT_C is enabled. The data of the present embodiment is represented by D<3:0>. The test data transmitted after the clock positive edge-triggered signal CLKOUT_T is referred to as the positive edge test data D+. The test data transmitted after the clock negative edge-triggered signal CLKOUT_C is enabled is referred to as the negative edge test data D−. In the present embodiment, the output time of the positive edge test data D+ and the negative edge test data D− is both half of one complete clock cycle tCK in the clock signal DQS. For ease of illustration, D<3:0> in the positive edge test data D+ is [0, 1, 0, 1], and D<3:0> in the negative edge test data D− is [1, 0, 1, 0].

However, as the transmission rate of the communication protocol adopted by the low-power DRAM device gradually increases (for example, developed from double data rate first-generation synchronous dynamic random-access memory (DDR SDRAM) to double data rate fourth-generation synchronous dynamic random-access memory (DDR4 SDRAM)), transition of the data D<3:0> becomes even faster. When the external test machine uses the data reading device 100 to obtain the test data in the chip, it is possible that the external test machine cannot learn the clock signal DQS located in the chip and its rate and thus cannot find the data valid window of the data D<3:0>. For example, in FIG. 2, a data valid window DVW1 corresponding to the positive edge test data D+ and a data valid window DVW2 corresponding to the negative edge test data D− can hardly be learned by the test machine. In other words, as the data transmission speed increases, the test machine cannot locate a suitable timing in the transitions of the data D<3:0> to find a time point (also referred to as a strobe point) for capturing the signal. Namely, it cannot effectively capture the desired information in the data valid window of the data D<3:0>.

Therefore, in the present embodiment, additional pins and relevant circuits are added to the data serialization circuit 120 of FIG. 1 to use the trigger mask signal DMASK to mask one of the clock positive edge-triggered signal CLKOUT_T and the clock negative edge-triggered signal CLKOUT_C and thereby increase the data valid window of a part of the test data. The test machine may selectively mask one of the clock positive edge-triggered signal CLKOUT_T and the clock negative edge-triggered signal CLKOUT_C by adjusting the trigger mask signal DMASK, which will be described with reference to FIG. 3 below.

Figure 3:
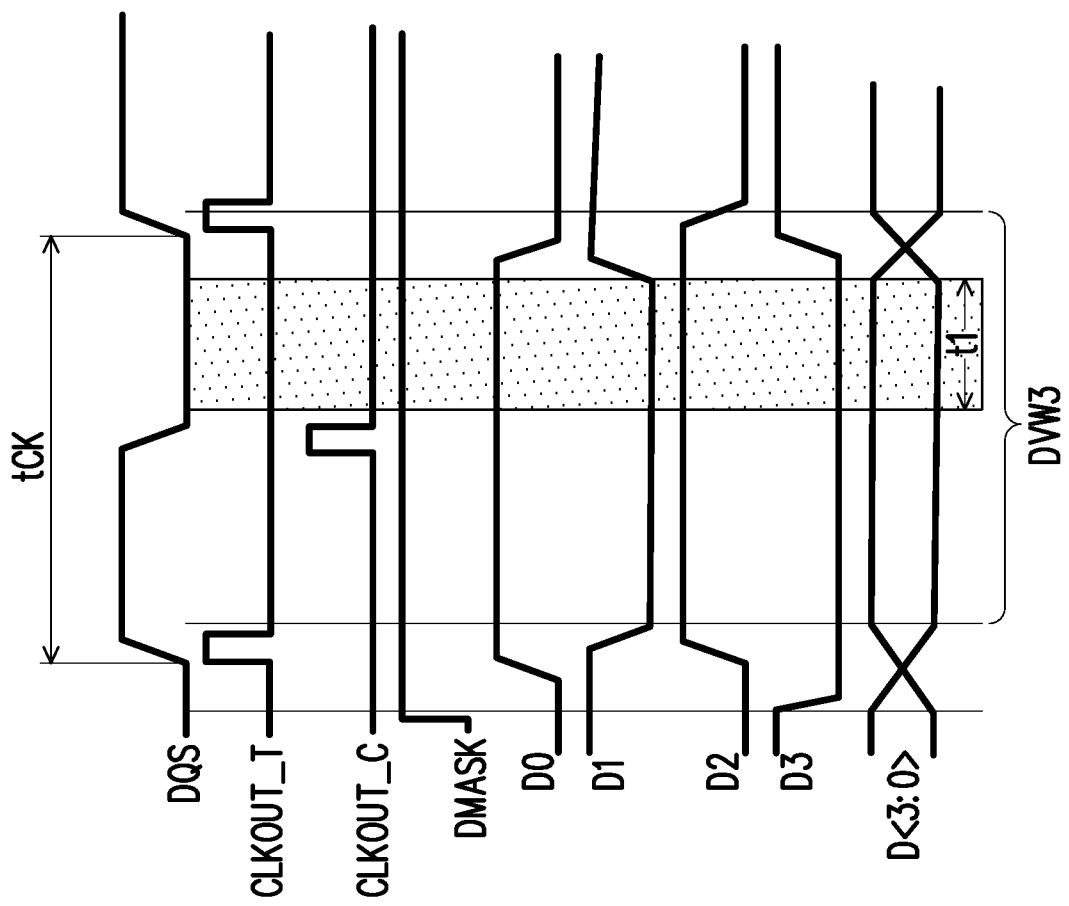
FIG. 3 is a waveform diagram illustrating a clock signal DQS, a clock positive edge-triggered signal CLKOUT_T, a clock negative edge-triggered signal CLKOUT_C, a trigger mask signal DMASK, and test data D0 to D3 and D<3:0> according to an embodiment of the invention.

In the embodiment of FIG. 3, the enabled (i.e., logic "1") trigger mask signal DMASK is used to select to mask the clock negative edge-triggered signal CLKOUT_C and not to mask the clock positive edge-triggered signal CLKOUT_T, such that the data serialization circuit 120 normally outputs the positive edge test data D+ when the clock positive edge-triggered signal CLKOUT_T is enabled and does not output the negative edge test data D− because the clock negative edge-triggered signal CLKOUT_C is enabled. Accordingly, a data valid window DVW3 of the positive edge test data D+ is increased by a time t1 compared to the data valid window DVW2 in FIG. 2. The output time of the positive edge test data D+ is increased from half of one complete clock cycle tCK in the clock signal DQS to one complete clock cycle tCK, such that the data valid window DVW3 of the positive edge test data D+ is increased accordingly.

In the embodiment of FIG. 3, the clock negative edge-triggered signal CLKOUT_C is already masked, which thus only allows a part of the test data (i.e., the positive edge test data D+) to be output to the pad 140 of FIG. 1. Therefore, if the complete test data is to be obtained, it is necessary for the external test machine to adjust the trigger mask signal DMASK from being enabled (i.e., logic "1") to being disabled, such that the clock positive edge-triggered signal CLKOUT_T is masked and cannot output the positive edge test data D+. Accordingly, the negative edge test data D− corresponding to the clock negative edge-triggered signal CLKOUT_C can be output to the pad 140 of FIG. 1. In other words, the external test machine can obtain the positive edge test data D+ and the negative edge test data D− with more time by adjusting the trigger mask signal DMASK.

In the present embodiment, an implemented circuit of the data serialization circuit 120 is described with reference to FIG. 4 as an example. A person implementing the present embodiment shall be able to implement the data serialization circuit 120 by using another circuit in line with the spirit of the present embodiment according to his/her requirements, and the invention is not limited hereto.

Figure 4:
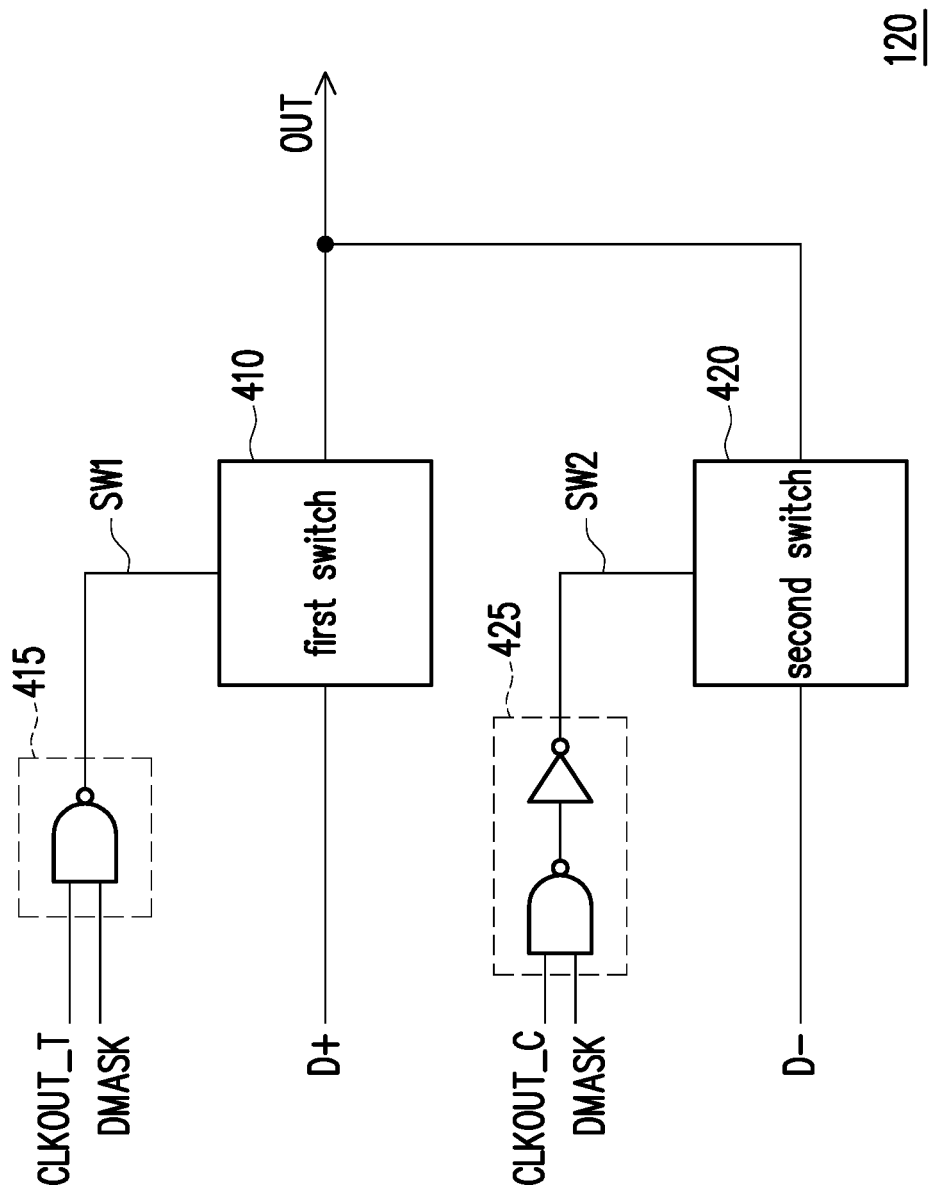
FIG. 4 is a block diagram illustrating a data serialization circuit 120 in FIG. 1.

Referring to FIG. 4, the data serialization circuit 120 mainly includes a first switch 410, a second switch 420, a first combinational logic 415, and a second combinational logic 425. The first combinational logic 415 receives the clock positive edge-triggered signal CLKOUT_T and the trigger mask signal DMASK and generates a first switch signal SW1. The second combinational logic 425 receives the clock negative edge-triggered signal CLKOUT_C and the trigger mask signal DMASK and generates a second switch signal SW2. A control terminal of the first switch 410 receives the first switch signal SW1. A receiving terminal of the first switch 410 receives the positive edge test data D+. An output terminal of the first switch 410 is coupled to an output terminal OUT of the data serialization circuit 120. A control terminal of the second switch 420 receives the second switch signal SW2. A receiving terminal of the second switch 420 receives the negative edge test data D−. An output terminal of the second switch 420 is also coupled to the output terminal OUT of the data serialization circuit 120. Therefore, when the trigger mask signal DMASK is enabled (i.e., logic "1"), the first combinational logic 415 enables the first switch signal SW1 according to the trigger mask signal DMASK and the clock positive edge-triggered signal CLKOUT_T. The second combinational logic 425 has the second switch signal SW2 constantly disabled according to the trigger mask signal DMASK and the clock negative edge-triggered signal CLKOUT_C. Therefore, the receiving terminal of the first switch 410 is coupled to the output terminal of the first switch 410 due to enablement of the first switch signal SW1 to thereby output the positive edge test data D+.

Conversely, when the trigger mask signal DMASK is disabled (i.e., logic "0"), the first combinational logic 415 has the first switch signal SW1 constantly disabled according to the trigger mask signal DMASK and the clock positive edge-triggered signal CLKOUT_T. The second combinational logic 455 enables the second switch signal SW2 according to the trigger mask signal DMASK and the clock negative edge-triggered signal CLKOUT_C. Therefore, the receiving terminal of the second switch 420 is coupled to the output terminal of the second switch 420 due to enablement of the second switch signal SW2 to thereby output the negative edge test data D−.

Figure 5:
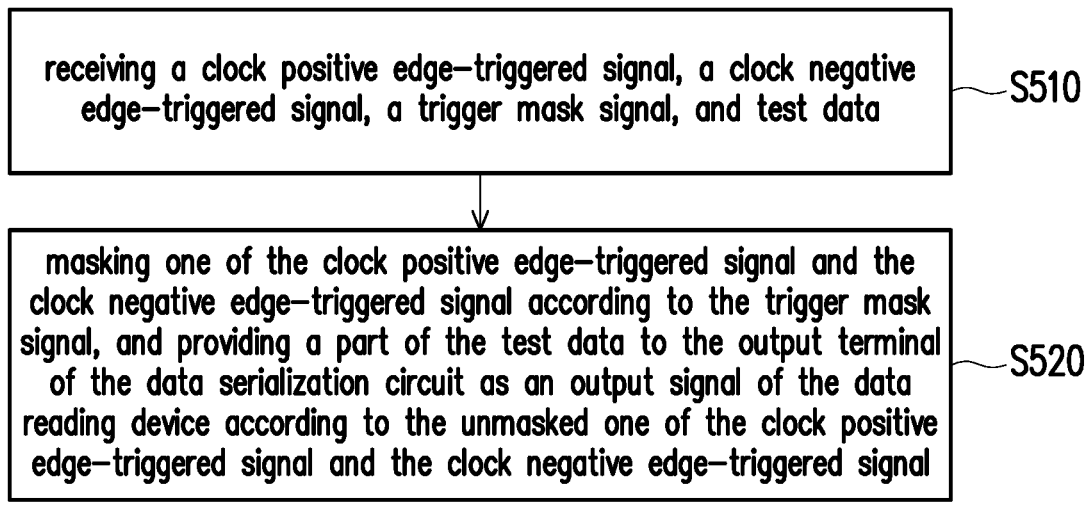
FIG. 5 is a flowchart illustrating a data reading method for design-for-testing according to an embodiment of the invention.

FIG. 5 is a flowchart illustrating a data reading method for design-for-testing according to an embodiment of the invention. The data reading method in FIG. 5 is applicable to the data reading device 100 including the data serialization circuit 120 in FIG. 1. Referring to FIG. 5, in step S510, the data serialization circuit 120 of the data reading device 100 receives a clock positive edge-triggered signal CLKOUT_T, a clock negative edge-triggered signal CLKOUT_C, a trigger mask signal DMASK, and test data. In step S520, the data serialization circuit 120 masks one of the clock positive edge-triggered signal CLKOUT_T and the clock negative edge-triggered signal CLKOUT_C according to the trigger mask signal DMASK, and provides a part of the test data to the output terminal of the data serialization circuit 120 as an output signal of the data reading device 100 according to the unmasked one of the clock positive edge-triggered signal CLKOUT_T and the clock negative edge-triggered signal CLKOUT_C.

Step S520 may also be implemented as the following steps. When the clock positive edge-triggered signal CLKOUT_T is masked according to the trigger mask signal DMASK, the data serialization circuit 120 outputs negative edge test data D−. When the clock negative edge-triggered signal CLKOUT_C is masked according to the trigger mask signal DMASK, the data serialization circuit 120 outputs positive edge test data D+. The implementations of the steps above are already disclosed in the embodiments of the invention.

In summary of the above, when reading the test signals, the data reading device and the data reading method according to the embodiments of the invention can use the additionally disposed trigger mask signal to block or mask one of the clock positive edge-triggered signal and the clock negative edge-triggered signal, and can use the other unmasked one of the triggered signals to obtain the corresponding part of the test data. Accordingly, the output time of the test data is increased from half of one clock cycle of the original clock to one clock cycle. Thereby, without adjusting the internal data type inside the chip using the data reading device or changing the clock or other relevant configurations, the available data valid window can be increased, and the external test machine can more easily determine accuracy of the test data obtained by the data reading device.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A data reading device for design-for-testing, comprising:
   a buffer configured to temporarily store test data; and
   a data serialization circuit coupled to the buffer, wherein the data serialization circuit receives a clock positive edge-triggered signal, a clock negative edge-triggered signal, a trigger mask signal, and the test data, wherein the test data comprises positive edge test data corresponding to the clock positive edge-triggered signal and negative edge test data corresponding to the clock negative edge-triggered signal,
   wherein the data serialization circuit masks one of the clock positive edge-triggered signal and the clock negative edge-triggered signal according to the trigger mask signal so as to output part of the test data,
   wherein the data serialization circuit outputs the positive edge test data when the clock negative edge-triggered signal is masked, and the data serialization circuit outputs the negative edge test data when the clock positive edge-triggered signal is masked,
   wherein one of the positive edge test data and the negative edge test data is outputted by an output terminal of the data serialization circuit to serve as an output signal of the data reading device according to the unmasked one of the clock positive edge-triggered signal and the clock negative edge-triggered signal.

2. The data reading device according to claim 1, wherein the data serialization circuit comprises:

a first switch, wherein a control terminal of the first switch receives a first switch signal generated by the clock positive edge-triggered signal and the trigger mask signal, a receiving terminal of the first switch receives the positive edge test data, and an output terminal of the first switch is coupled to the output terminal of the data serialization circuit; and a second switch, wherein a control terminal of the second switch receives a second switch signal generated by the clock negative edge-triggered signal and the trigger mask signal, a receiving terminal of the second switch receives the negative edge test data, and an output terminal of the second switch is coupled to the output terminal of the data serialization circuit, wherein when the clock positive edge-triggered signal is masked according to the trigger mask signal, the second switch signal is enabled, such that the receiving terminal of the second switch is coupled to the output terminal of the second switch to thereby output the negative edge test data, and when the clock negative edge-triggered signal is masked according to the trigger mask signal, the first switch signal is enabled, such that the receiving terminal of the first switch is coupled to the output terminal of the first switch to thereby output the positive edge test data.

3. The data reading device according to claim 1, further comprising:
an off-chip driver coupled to the data serialization circuit to receive the output signal of the data reading device; and
a pad electrically connected to the off-chip driver,
wherein the off-chip driver provides a part of the test data to the pad according to the output signal.

4. The data reading device according to claim 1, further comprising:
a memory array, wherein the test data is stored or generated by the memory array.

5. The data reading device according to claim 1, wherein the data serialization circuit masks one of the clock positive edge-triggered signal and the clock negative edge-triggered signal according to the trigger mask signal to thereby increase a data valid window of the part of the test data, wherein the part of the test data corresponds to the other unmasked one of the clock positive edge-triggered signal and the clock negative edge-triggered signal.

6. The data reading device according to claim 1, wherein the data reading device is applicable to a dynamic random-access memory (DRAM) device.

7. The data reading device according to claim 1, wherein the clock positive edge-triggered signal is enabled when a clock undergoes a transition from a negative edge to a positive edge, and the clock negative edge-triggered signal is enabled when the clock undergoes a transition from the positive edge to the negative edge.

8. A data reading method for design-for-testing applicable to a data reading device comprising a data serialization circuit, the data reading method comprising:
obtaining a clock positive edge-triggered signal, a clock negative edge-triggered signal, a trigger mask signal, and test data, wherein the test data comprises positive edge test data corresponding to the clock positive edge-triggered signal and negative edge test data corresponding to the clock negative edge-triggered signal;
masking one of the clock positive edge-triggered signal and the clock negative edge-triggered signal according to the trigger mask signal so as to output part of the test data, wherein the data serialization circuit outputs the positive edge test data when the clock negative edge-triggered signal is masked, and the data serialization circuit outputs the negative edge test data when the clock positive edge-triggered signal is masked; and
outputting one of the positive edge test data and the negative edge test data by an output terminal of the data serialization circuit to serve as an output signal of the data reading device according to the unmasked one of the clock positive edge-triggered signal and the clock negative edge-triggered signal.

9. The data reading method according to claim 8, wherein the data serialization circuit masks one of the clock positive edge-triggered signal and the clock negative edge-triggered signal according to the trigger mask signal to thereby increase a data valid window of the part of the test data, wherein the part of the test data corresponds to the other unmasked one of the clock positive edge-triggered signal and the clock negative edge-triggered signal.

* * * * *